(12) United States Patent
Chuang et al.

(10) Patent No.: US 11,162,996 B2
(45) Date of Patent: Nov. 2, 2021

(54) PROBING APPARATUS EQUIPPED WITH HEATING DEVICE FOR LIGHT EMITTING CHIP

(71) Applicant: MPI CORPORATION, Chu-Pei (TW)

(72) Inventors: Wen Pin Chuang, Chu-Pei (TW); Yi Ching Lo, Chu-Pei (TW); Hao Duan, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

(21) Appl. No.: 17/039,239

(22) Filed: Sep. 30, 2020

(65) Prior Publication Data

US 2021/0156903 A1    May 27, 2021

Related U.S. Application Data

(60) Provisional application No. 62/940,289, filed on Nov. 26, 2019.

(30) Foreign Application Priority Data

Apr. 7, 2020   (TW) ................................. 109111629

(51) Int. Cl.
*G01R 31/26*       (2020.01)
*G01R 31/28*       (2006.01)
*G01R 31/44*       (2020.01)

(52) U.S. Cl.
CPC ..... *G01R 31/2635* (2013.01); *G01R 31/2875* (2013.01); *G01R 31/44* (2013.01)

(58) Field of Classification Search
CPC ............ G01R 31/2874; G01R 31/2875; G01R 31/2877
See application file for complete search history.

(56) References Cited

U.S. PATENT DOCUMENTS

| 5,325,052 A * | 6/1994 | Yamashita | G01R 1/06738 |
| | | | 324/750.08 |
| 2002/0003037 A1* | 1/2002 | Cousineau | H01L 21/67103 |
| | | | 165/278 |

* cited by examiner

*Primary Examiner* — Tung X Nguyen
(74) *Attorney, Agent, or Firm* — Birch, Stewart, Kolasch & Birch, LLP

(57) ABSTRACT

A probing apparatus includes a carrier having an opening, a supporter disposed on the carrier in a way that its bottom surface faces toward the carrier, its top surface for disposition of a wafer, and its light permeable portion allowing light to pass through the top and bottom surfaces corresponding in position to the opening, an air heating device having a covering plate and an air supply unit, and a probing device having a probe protruding out of the bottom surface of the air heating device. A thermal air source provides thermal air to a heating space between the bottom surface of the air heating device and the top surface of the supporter through an air supply passage of the air supply unit. The probing apparatus can test light emitting efficiency of a light emitting chip in the wafer and heat the chip at the same time.

20 Claims, 10 Drawing Sheets

PROBING APPARATUS EQUIPPED WITH HEATING DEVICE FOR LIGHT EMITTING CHIP

BACKGROUND OF THE INVENTION

1. Field of the Invention

The present invention relates generally to probing apparatuses for testing light emitting chips and more particularly, to a probing apparatus equipped with a heating device for testing light emitting chips.

2. Description of the Related Art

During light emitting efficiency test of light emitting chips, such as light emitting diode chips, laser chips and so on, it usually makes a chip under test emit light in a way that conductive contacts of the chip under test are probed by probes of a probe card, and at the same time a light receiving device, e.g. an integrating sphere, receives the light emitted by the chip under test for measuring the light emitting efficiency thereof. Such testing process may be performed to a large number of chips connected with each other in a manufactured wafer, that is to say, the manufactured wafer has not been diced into a large number of separated chips. For a light emitting chip provided on two opposite surfaces thereof with conductive contacts and light emitting portions respectively, e.g. a flip-chip type light emitting chip, the aforementioned light emitting efficiency test is usually performed in a way that the conductive contacts of the light emitting chip face up and the light emitting portions face down. In other words, the probes are located above the top surface of the wafer and moves downwardly to probe the conductive contacts of the chip and the light receiving device is located below the bottom surface of the wafer to receive the light emitted downwardly from the light emitting portions of the chip.

Although a probing apparatus is currently available for optical test of light emitting chips on a wafer before dicing, the chips under test cannot be heated during the test, so that the light emitting efficiency test cannot be performed to the chips under test at a specific high temperature.

SUMMARY OF THE INVENTION

The present invention has been accomplished in view of the above-noted circumstances. It is an objective of the present invention to provide a probing apparatus equipped with a heating device for testing a light emitting chip, which is able to perform light emitting efficiency test to the light emitting chip on a wafer before dicing and to heat the light emitting chip at the same time.

To attain the above objective, the present invention provides a probing apparatus equipped with a heating device for a light emitting chip, which includes a carrier, a supporter, a thermal air source, an air heating device, and a probing device. The carrier has an opening and the supporter has a top surface, a bottom surface, and at least one light permeable portion for light to pass through the top surface and the bottom surface. The supporter, which is disposed on the carrier in a way that the bottom surface faces toward the carrier and the light permeable portion corresponds in position to the opening, is adapted for a wafer to be disposed on the top surface. The air heating device includes a covering plate and at least one air supply unit disposed on the covering plate. The air heating device has a bottom surface facing toward the top surface of the supporter so as to define a heating space between the bottom surface of the air heating device and the top surface of the supporter. The air supply unit has an air supply passage communicating with the thermal air source so that the thermal air provided by the thermal air source can enter into the heating space through the air supply passage. The probing device has a probe protruding out of the bottom surface of the air heating device for probing a light emitting chip of the wafer.

As a result, for the light emitting chip such as the flip-chip type chip, the face-up conductive contacts thereof are probed by the probe and the light emitting chip emits light downwardly when being probed by the probe, so the emitted light can pass through the light permeable portion of the supporter and be received by a light receiving device, e.g. an integrating sphere, disposed below the opening of the carrier to measure the light emitting efficiency thereof. At the same time, the thermal air source can provide the thermal air with specific temperature to the heating space through the air supply passage of the air heating device to heat the wafer, which includes the light emitting chip under test, located in the heating space. In this way, the probing apparatus equipped with the heating device can perform the light emitting efficiency test to the light emitting chip under specific high temperature conditions. For example, a temperature that may be reached because of the heat generated from the light emitting chip in practical use can be simulated so as to detect whether the light emitting efficiency of the light emitting chip may be decreased when the temperature of the light emitting chip rises due to the heat generated therefrom.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
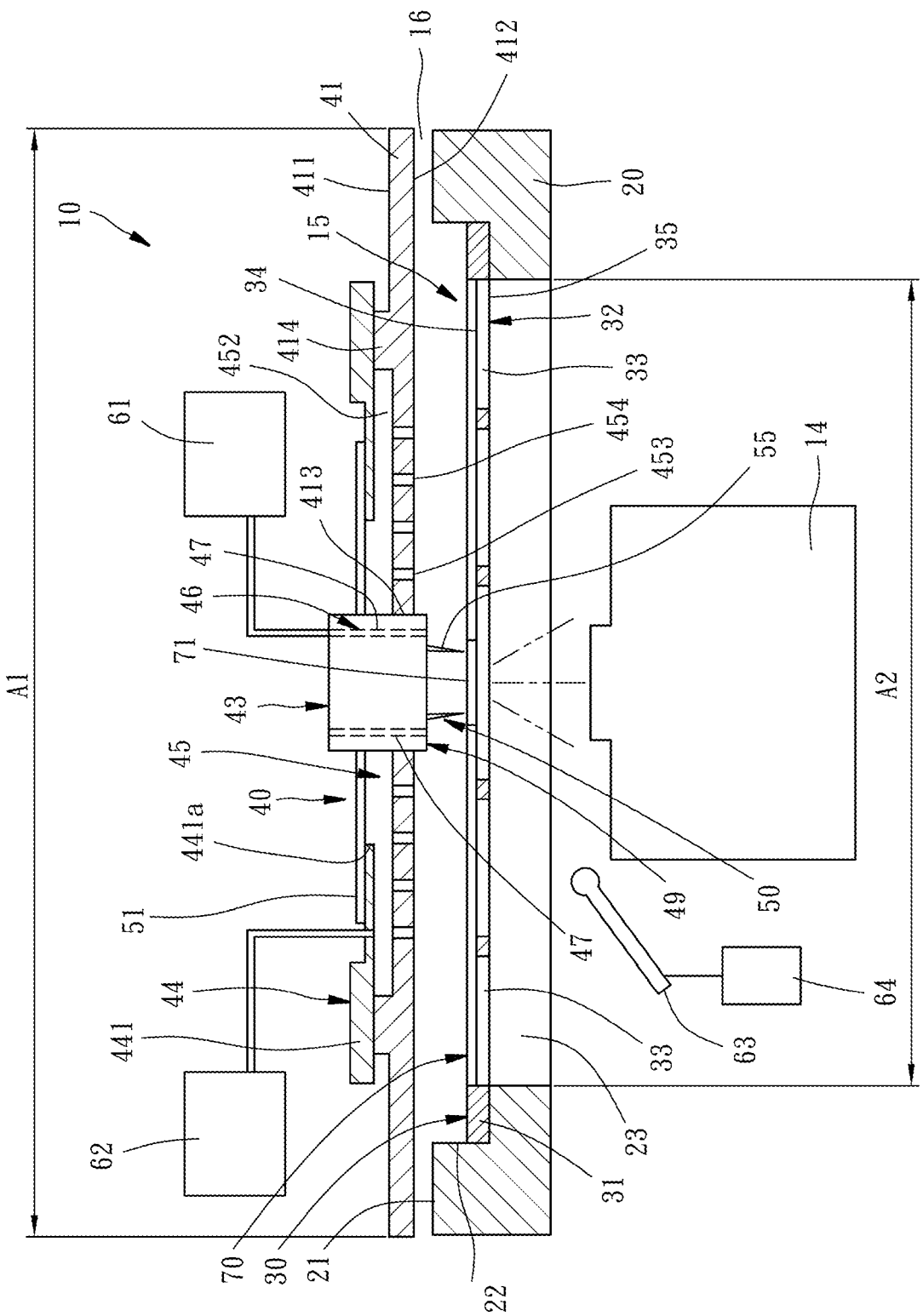
FIG. 1 is a schematic sectional view of a wafer and a probing apparatus according to a first preferred embodiment of the present invention.

First of all, it is to be mentioned that in the following embodiments and claims, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements. Besides, for the convenience of illustration, the components and the structure shown in the figures of the present invention are not drawn according to the real scale and amount. In the following embodiments and the accompanying drawings, same or similar reference numerals designate same or similar elements or the structural features thereof.

Referring to FIG. 1, a probing apparatus 10 according to a first preferred embodiment of the present invention includes a carrier 20, a supporter 30, an air heating device 40, a probing device 50, two thermal air sources 61 and 62, a temperature sensor 63, and a temperature control device 64 electrically connected with the two thermal air sources 61 and 62 and the temperature sensor 63. The probing apparatus 10 is adapted to perform light emitting efficiency test to a plurality of light emitting chips 71 included in a wafer 70, such as vertical-cavity surface-emitting laser array chips (hereinafter referred to as VCSEL chips). The wafer 70 is a non-diced wafer and contains thousands or more tiny light emitting chips 71 connected with each other. In other words, the probing apparatus 10 is adapted for testing the light emitting chips 71 on a wafer before dicing. FIG. 1 is a schematic sectional view of the probing apparatus 10 of the present invention and the wafer 70. The detailed configuration of the probing apparatus 10 in this embodiment is partially shown in FIGS. 2-8. For the simplification of the figures and the convenience of illustration, the figures of the present invention only schematically show one of the light emitting chips 71, which is represented by a section of the wafer 70 in FIG. 1. In FIGS. 2-8, no light emitting chip is drawn but only the wafer 70 is shown therein.

Figure 2:
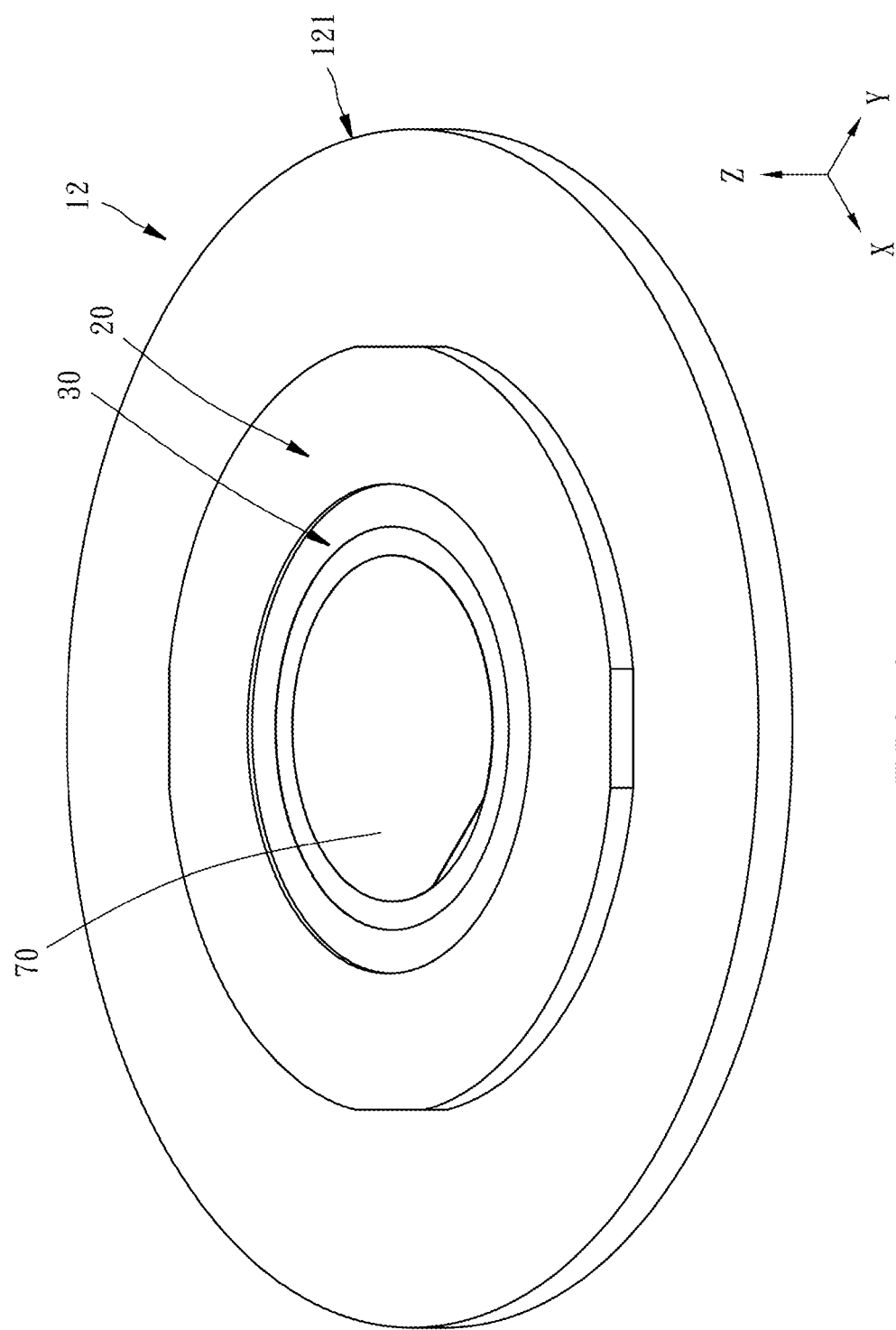
FIG. 2 is an assembled perspective view of a horizontally movable structure of the probing apparatus and the wafer.
Figure 3:
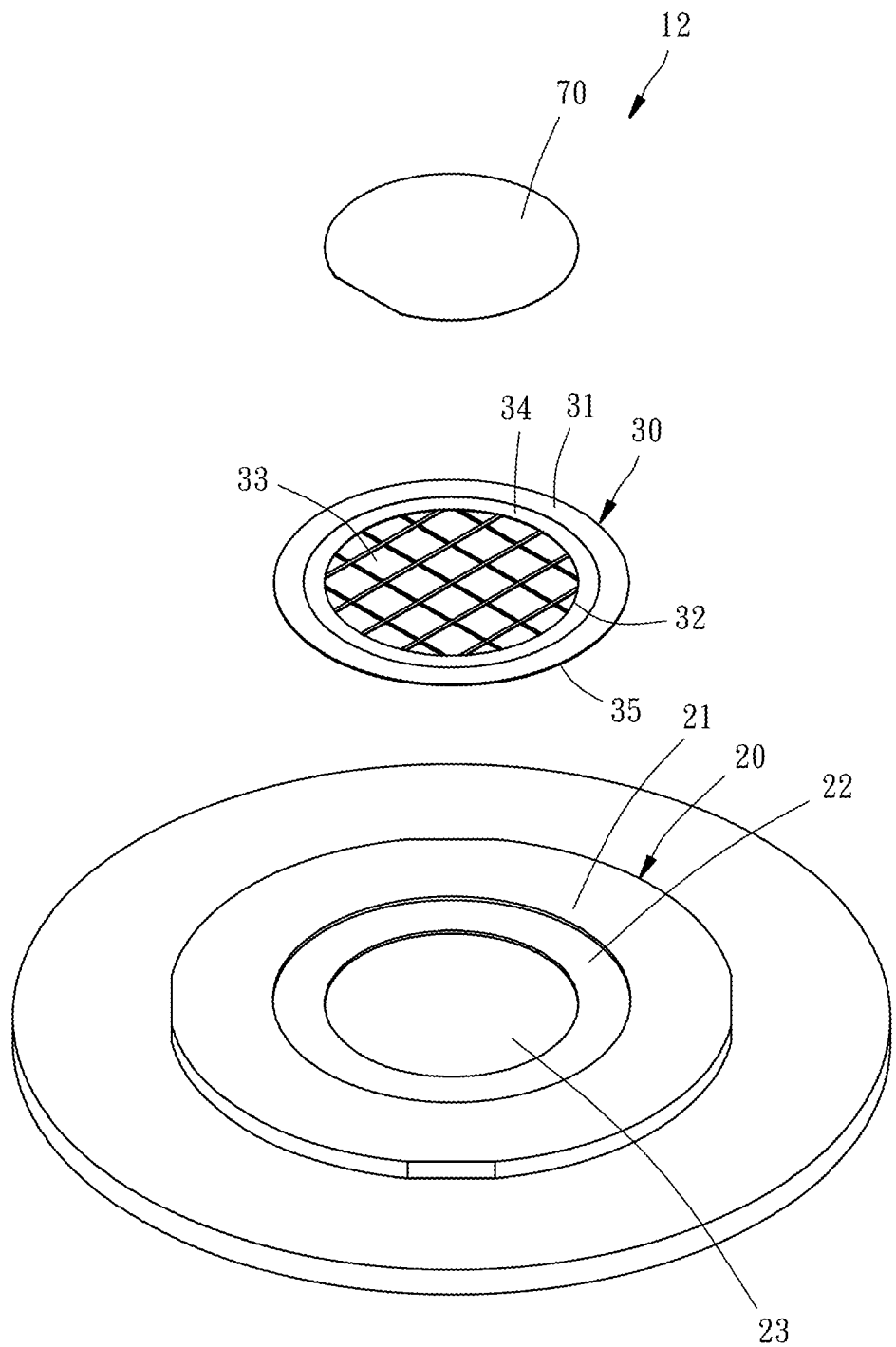
FIG. 3 is an exploded perspective view of the horizontally movable structure and the wafer.
Figure 4:
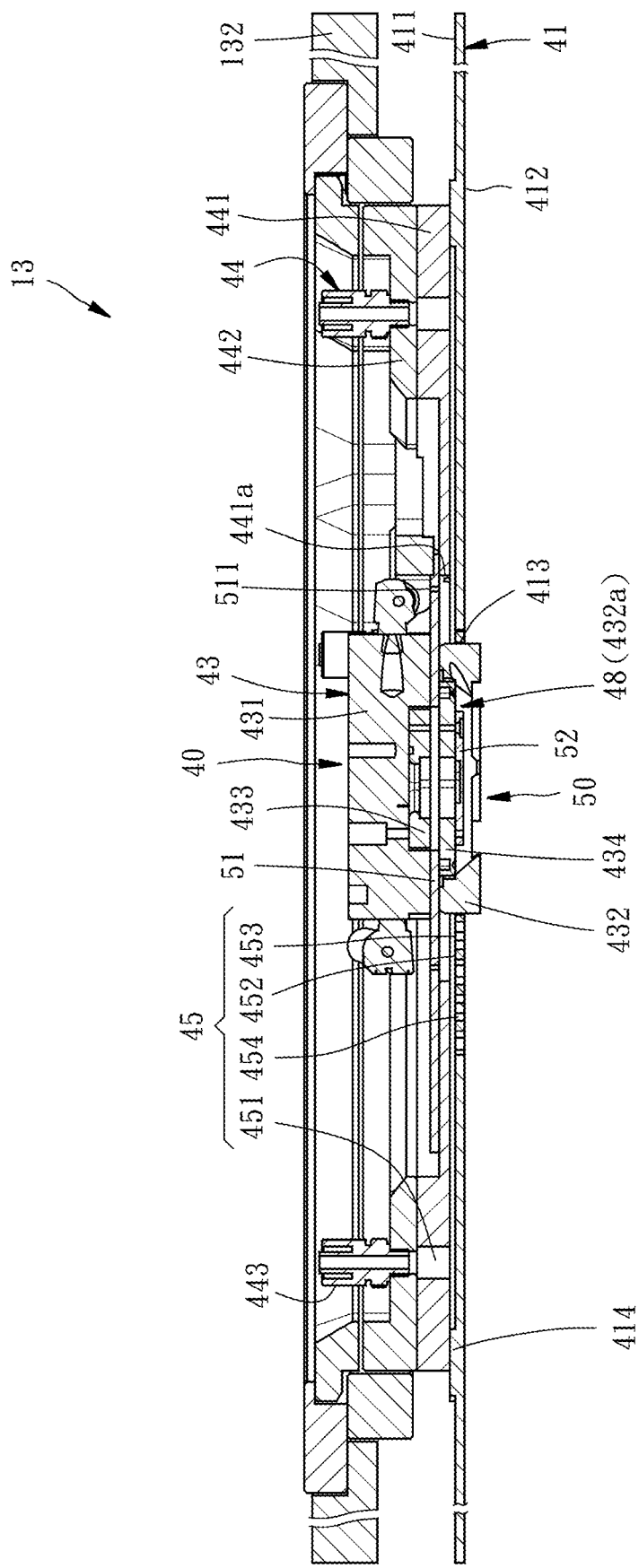
FIG. 4 is a sectional view of a vertically movable structure of the probing apparatus.

The probing apparatus 10 in this embodiment may, but unlimited to, include a triaxial drive structure (not shown) and a horizontally movable structure 12 as shown in FIGS. 2 to 3 and a vertically movable structure 13 as shown in FIG. 4, which are driven by the triaxial drive structure to displace. Specifically speaking, the triaxial drive structure includes a base unit (not shown) and two horizontally driving devices (not shown) and a vertically driving device (not shown), which are disposed on the base unit. The horizontally movable structure 12 is disposed on the triaxial drive structure in a way that the horizontally movable structure 12 can be driven by the two horizontally driving devices to move along an X-axis and a Y-axis. The vertically movable structure 13 is disposed on the triaxial drive structure in a way that the vertically movable structure 13 can be driven by the vertically driving device to move along a Z-axis and the vertically movable structure 13 is located above the horizontally movable structure 12. The aforementioned horizontally and vertically driving devices are structurally the same with the conventional linearly driving device, thereby not detailedly described hereinafter.

Referring to FIG. 2 and FIG. 3, the horizontally movable structure 12 includes a base 121 driven by the aforementioned horizontally driving device to move along the X-axis and Y-axis, and the aforementioned carrier 20 and supporter 30, wherein the carrier 20 and the supporter 30 are collectively defined as a chuck. The carrier 20 is disposed on the base 121 in a way that the carrier 20 can be driven by a first rotary driving device (not shown) to rotate. The supporter 30 is detachably fastened on the carrier 20 in a way that the supporter 30 is pressed by a plurality of pressing plates (not shown) fastened on the base 121 by screws (not shown). The wafer 70 is placed on the supporter 30.

Referring to FIG. 4, the vertically movable structure 13 includes a base 132 driven by the aforementioned vertically driving device to move along the Z-axis, and the aforementioned air heating device 40 and probing device 50. The air heating device 40 and the probing device 50 are disposed on the base 132 in a way that the air heating device 40 and the probing device 50 can be driven by a second rotary driving device (not shown) to rotate. The aforementioned rotary driving devices are structurally the same with the conventional rotary driving device, thereby not detailedly described hereinafter.

It can be known from the above description that the carrier 20, supporter 30 and wafer 70 in this embodiment can be driven together by the aforementioned horizontally driving devices and first rotary driving device to displace along the X-axis and Y-axis and rotate about the Z-axis, and the air heating device 40 and probing device 50 in this embodiment can be driven together by the aforementioned vertically driving device and second rotary driving device to displace along the Z-axis and rotate about the Z-axis. However, the arrangements of the carrier 20, supporter 30, air heating device 40, and probing device 50 in the present invention are unlimited to those described in this embodiment, as long as the air heating device 40 and probing device 50 are able to move relative to the carrier 20 and supporter 30 hence to move toward and away from the wafer 70. Besides, the air heating device 40 and the probing device 50 are unlimited to move simultaneously.

Figure 10:
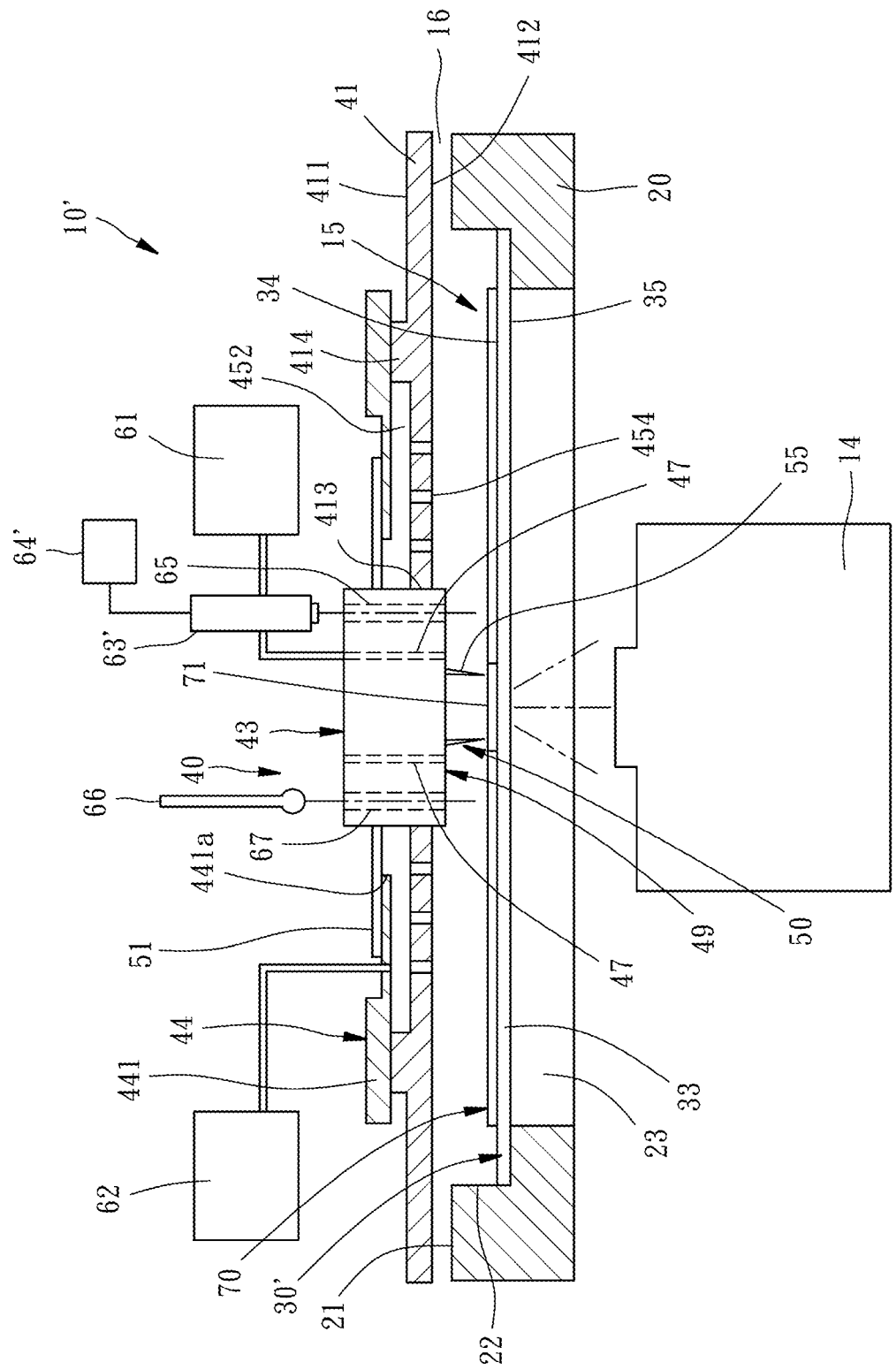
FIG. 10 is a schematic sectional view of a wafer and a probing apparatus according to a second preferred embodiment of the present invention.

As shown in FIG. 1 and FIG. 3, the carrier 20 has a top surface 21, a recess 22 recessed from the top surface 21, and an opening 23 located in the recess 22. The supporter 30 has a ring-shaped outer frame 31 and a latticed section 32 located in the outer frame 31. The latticed section 32 has a plurality of hollow light permeable portions 33, which means each light permeable portion 33 is a hole penetrating through a top surface 34 and a bottom surface 35 of the supporter 30 for light to pass through the top and bottom surfaces 34 and 35 of the supporter 30. The supporter 30 is disposed in the recess 22 in a way that the bottom surface 35 faces toward the carrier 20 and is adapted for the wafer 70 to be disposed on the top surface 34. Besides, the light permeable portions 33 correspond in position to the opening 23, which means the light permeable portions 33 are located right above the opening 23 to communicate with the opening 23. In this way, even though the wafer 70 is a thin wafer, it can still be supported by the supporter 30 to avoid bending. Besides, the light emitting chips 71 included in the wafer 70 may be flip-chip type chips, such as VCSEL chips, laser chips and so on, and have the conductive contacts (not shown) facing up for being probed by the probing device 50, as will be described in detail below. The light emitting chips 71 emit light downwardly when being probed by the probing device 50 and the light can pass through the light permeable portions 33 of the supporter 30, so that as shown in FIG. 1, a light receiving device 14, e.g. an integrating sphere, disposed below the opening 23 of the carrier 20 can receive the light emitted from the light emitting chips 71 to measure the light emitting efficiency thereof. It should be understood that the supporter 30 in the present invention is unlimited to the above-described latticed design with hollow light permeable portions 33, as long as the supporter 30 is able to support the wafer 70 and allows the light emitted from the light emitting chips 71 to pass through. For example, the supporter 30 may be or include a transparent plate as shown in FIG. 10, which will be specified in the following.

Figure 5:
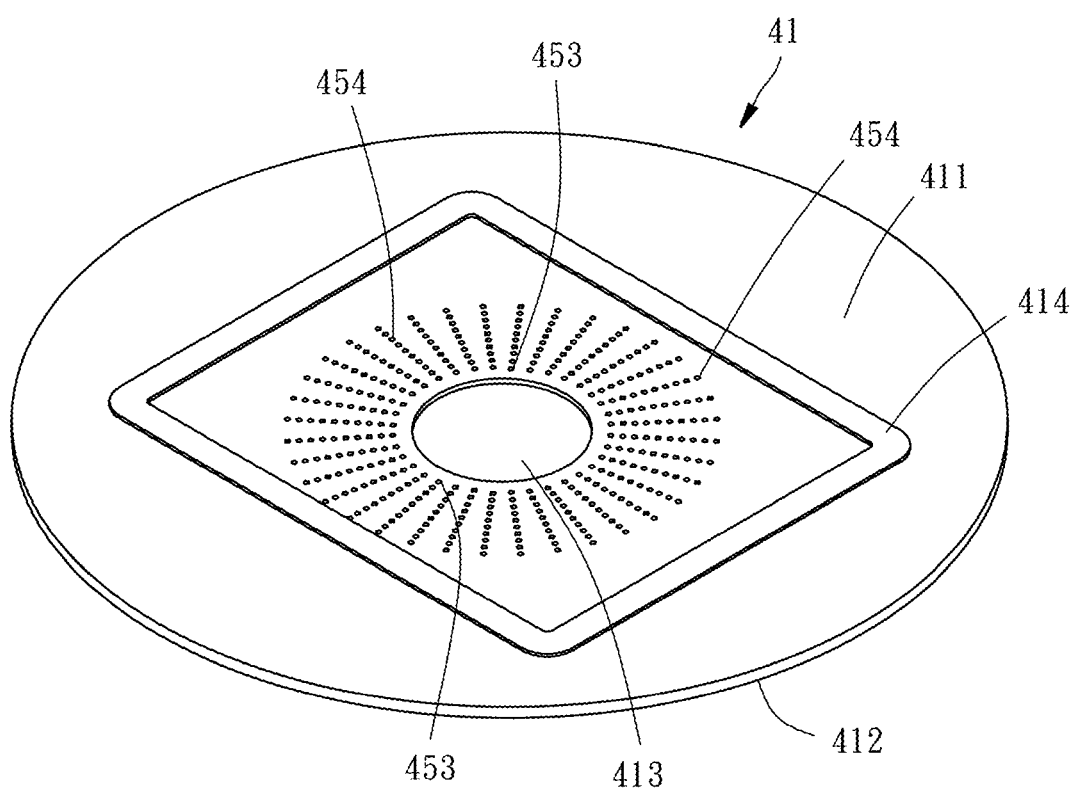
FIG. 5 is a perspective view of a covering plate of the vertically movable structure.
Figure 9:
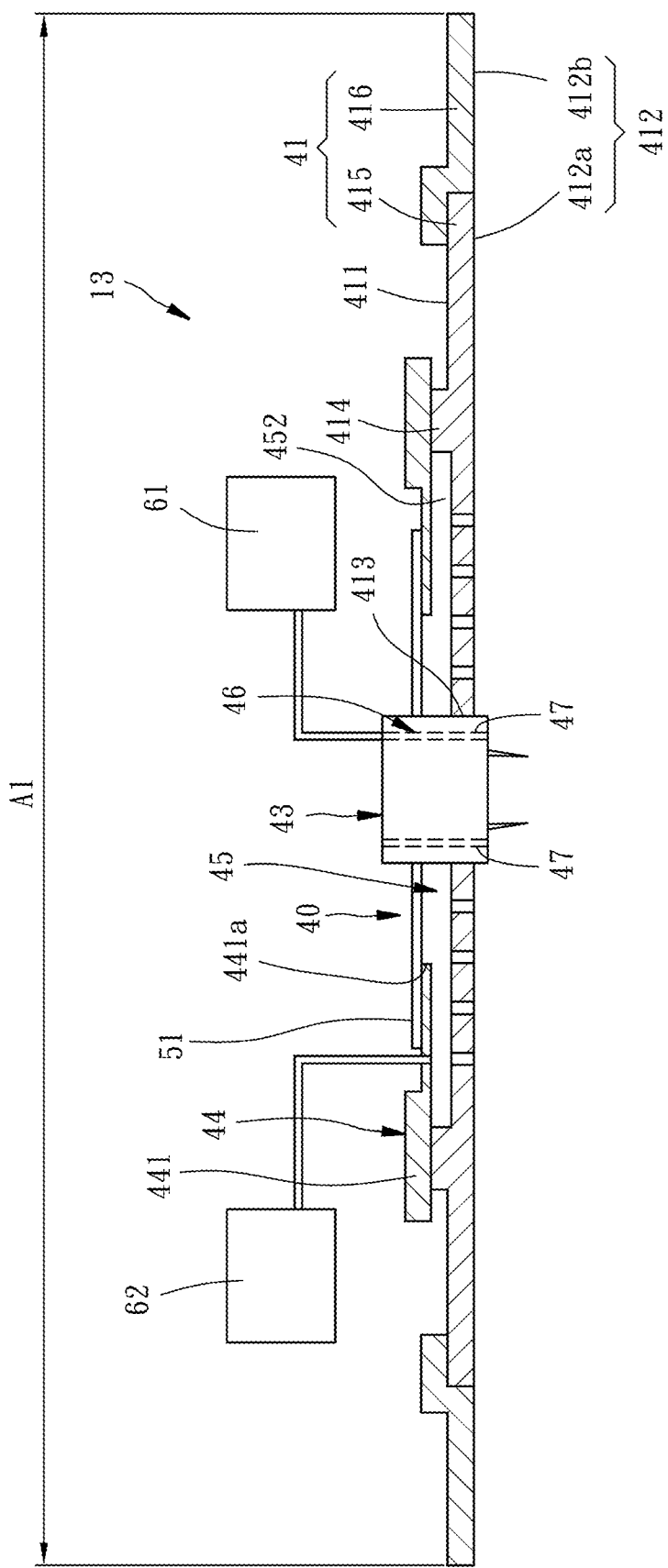
FIG. 9 is similar to the upper part of FIG. 1, but showing a different form of the covering plate of the vertically movable structure.

As shown in FIG. 1 and FIG. 4, the air heating device 40 in this embodiment includes a covering plate 41, a central air supply unit 43 disposed at the center of the covering plate 41 and combined with the probing device 50, and an outer air supply unit 44 surrounding the central air supply unit 43 and the probing device 50. The covering plate 41 may be configured as shown in FIG. 1 and FIG. 4, which includes only a plate, such as the covering plate 41 including only a circular plate as shown in FIG. 5. Alternatively, the covering plate 41 may be configured as shown in FIG. 9, which includes a plate 415 and an outer ring 416 fixed on the periphery of the plate 415 so as to increase the coverage of the covering plate 41.

In this embodiment, the covering plate 41 not only provides covering effect in the surrounding of the central air supply unit 43, but also collectively provides air supplying function in the surrounding of the central air supply unit 43 in combination with the outer air supply unit 44. Specifically speaking, referring to FIGS. 1, 4 and 5, the covering plate 41 has a top surface 411, a bottom surface 412, and an installation hole 413 located at the center of the covering plate 41 and penetrating through the top surface 411 and the bottom surface 412. The outer air supply unit 44 includes a top cover 441 disposed on a square fence 414 protruding from the top surface 411 of the covering plate 41 as shown in FIG. 1 and FIG. 4, a frame 442 disposed on the top cover 441 as shown in FIG. 4, a plurality of air inlet connectors 443 (unlimited in amount) disposed on the frame 442 as shown in FIG. 4, and an air supply passage 45 as shown in FIG. 1 and FIG. 4. As shown in FIG. 4, the air supply passage 45 includes a plurality of air inlets 451 (unlimited in amount) penetrating through the frame 442 and the top cover 441 and connected and communicating with the air inlet connectors 443 respectively, a communicating air chamber 452 located between the top cover 441 and the top surface 411 of the covering plate 41 and communicating with the air inlets 451, and a plurality of air outlets 453 and 454 penetrating through the top surface 411 and bottom surface 412 of the covering plate 41 and communicating with the communicating air chamber 452. As shown in FIG. 5, the air outlets 453 are the little circular holes arranged in three concentric circles surrounding the installation hole 413 and the air outlets 454 are the rest little circular holes arranged in many concentric circles surrounding the air outlets 453. The air inlet connectors 443 communicate with the thermal air source 62 (as shown in FIG. 1) through pipes respectively.

Figure 6:
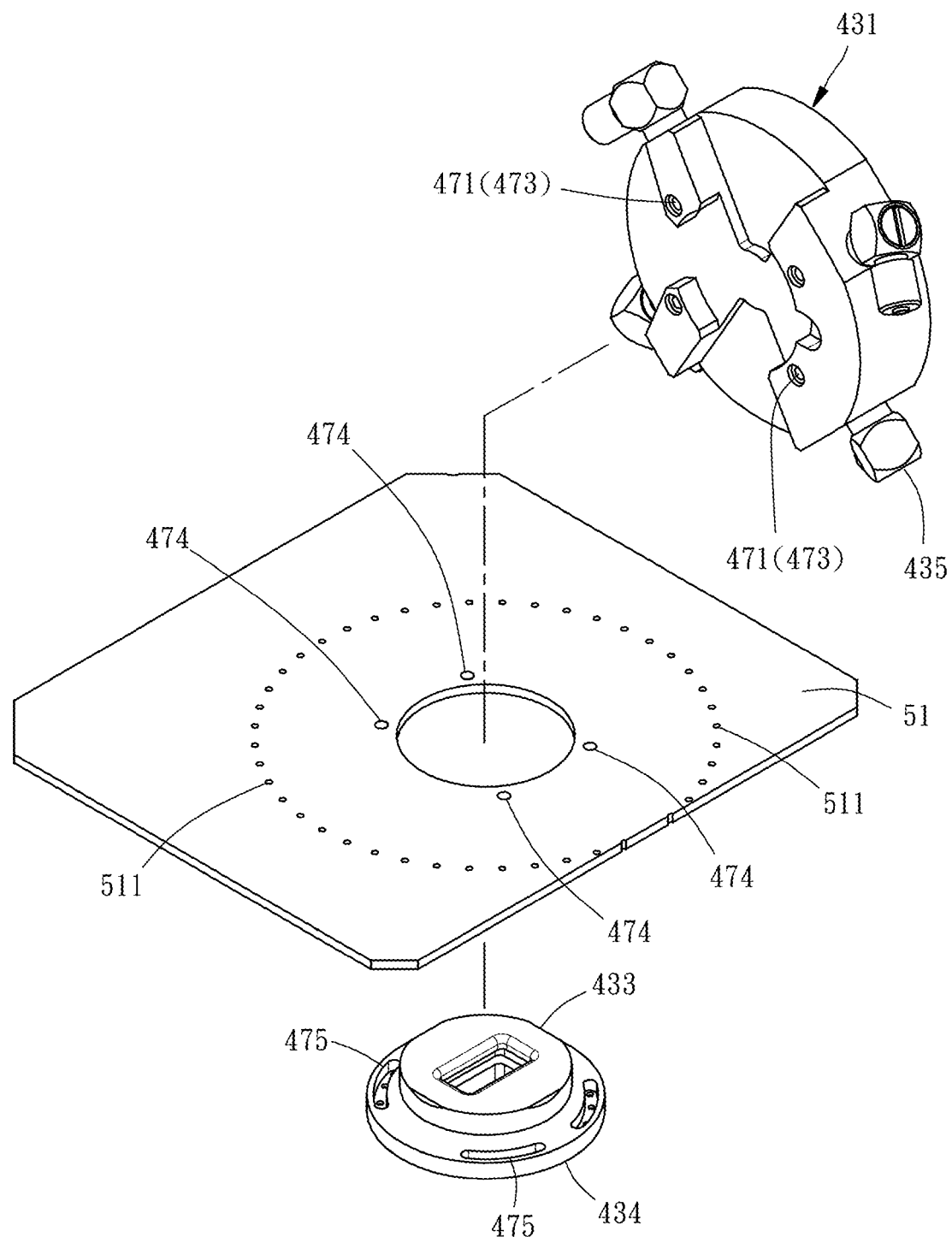
FIG. 6 is an exploded perspective view of some members of the vertically movable structure.
Figure 7:
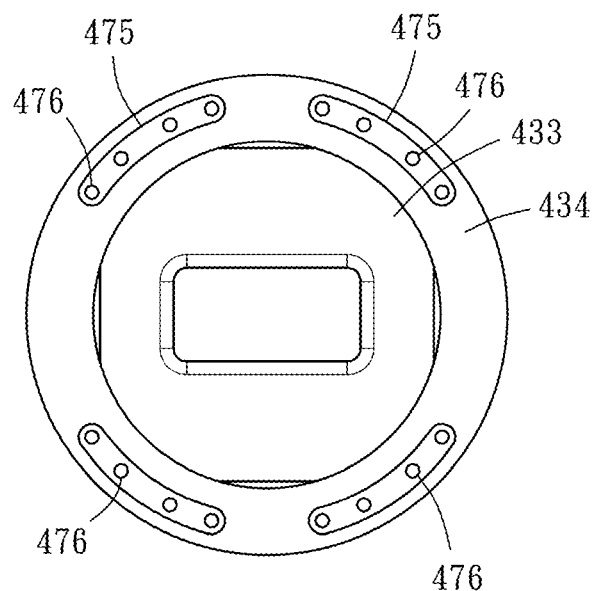
FIG. 7 and FIG. 8 are top and bottom views of a connecting unit of the vertically movable structure respectively.
Figure 8:
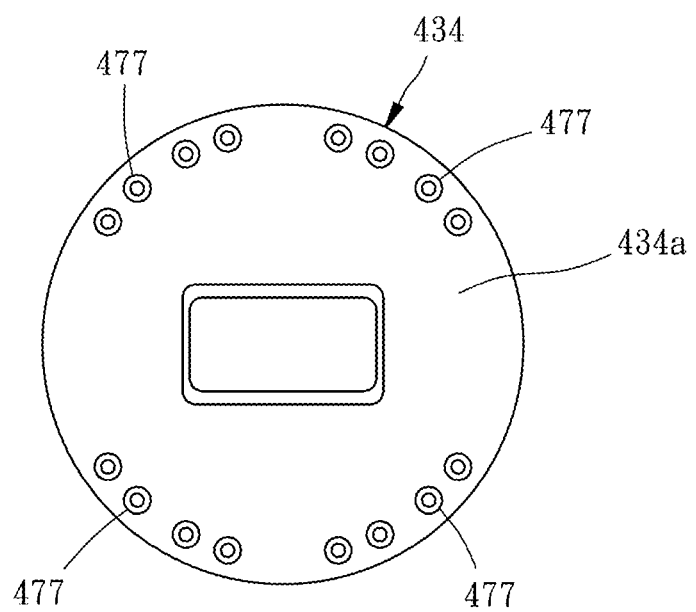

Referring to FIGS. 4 and 6, the central air supply unit 43 includes an upper member 431, a lower member 432, a connecting unit disposed between the upper member 431 and the lower member 432 and including two connecters 433 and 434, and four air inlet connectors 435 disposed on the peripheral surface of the upper member 431. The probing device 50 includes a circuit board 51 disposed between the upper member 431 and the connecter 434, and a space transformer 52 (as shown in FIG. 4) disposed on a bottom surface 434a of the connecter 434 (as shown in FIG. 8). The upper member 431, the lower member 432, the two connecters 433 and 434, the circuit board 51, and the space transformer 52 are fastened to each other by screws (not shown). The circuit board 51 is disposed on the top cover 441 and detachably fastened on the top cover 441 in a way that the circuit board 51 is pressed by pressing plates (not shown) fastened on the top cover 441 by screws (not shown). In this way, the central air supply unit 44 and the probing device 50 are fastened to the covering plate 41 and the outer air supply unit 44. The lower member 432 is located in the installation hole 413 of the covering plate 41 and is configured to slightly protrude out of the bottom surface 412 of the covering plate 41. The upper member 431 is located above the top surface 411 of the covering plate 41 in a way that the four air inlet connectors 435 are located above the circuit board 51. The four air inlet connectors 435 communicate with the thermal air source 61 (as shown in FIG. 1) through pipes respectively.

The central air supply unit 43 also includes an air supply passage 46, as shown in FIG. 1. The air supply passage 46 includes four flow channels 47 connected and communicating with the four air inlet connectors 435 respectively, and an open air chamber 48 communicating with the four flow channels 47 as shown in FIG. 4. In FIG. 1, only two flow channels 47 of the air supply passage 46 are schematically shown and represented by two through holes, and the open air chamber 48 is not shown. The air supply passage is unlimited to have such open air chamber. The detail configuration of the air supply passage 46 may, but unlimited to, be as described in the following. Specifically speaking, referring to FIGS. 6-8, the upper member 431 has four air inlets 471 connected and communicating with the four air inlet connectors 435 respectively. Each air inlet 471 includes a transverse section (not shown) connected with the air inlet connector 435 and a vertical section 473 extending downwardly from the transverse section. The circuit board 51 has four through holes 474 communicating with bottom ends of the vertical sections 473 of the four air inlets 471 respectively. The connecter 434 has four recesses 475 communicating with the four through holes 474 respectively and each recess 475 is provided therein with four air outlets 476. Each aforementioned flow channel 47 includes an air inlet 471, a through hole 474, a recess 475 and four air outlets 476, which communicate with each other. Each flow channel 47 has four air outlet openings 477, i.e. bottom ends of the air outlets 476, located on the bottom surface 434a of the connecter 434, as shown in FIG. 8. Besides, as shown in FIG. 4, the lower member 432 is provided at the center thereof with a through hole 432a. The aforementioned open air chamber 48 communicating with the air outlet openings 477 of the flow channels 47 is formed by the through hole 432a.

The probing device 50 actually further includes a probe head (not shown) having at least one probe 55 as shown in FIG. 1. The probe head is disposed on the bottom surface of the space transformer 52 in a way that the probe 55 is located in the open air chamber 48 of the central air supply unit 43 and protrudes out of the bottom surface 49 of the air heating device 40 for probing the conductive contact of the light emitting chip 71. In this way, the light emitting chip 71 can emit light by receiving a test signal, which is outputted from a testing machine (not shown) located above the probing device 50 to the circuit board 51, through the probe 55, the space transformer 52 and the circuit board 51, and the emitted light is received by the light receiving device 14 for being further tested. At this time, as shown in FIG. 1, the bottom surface 49 of the air heating device 40, which includes the bottom surface 412 of the covering plate 41, faces toward the top surface 34 of the supporter 30 very closely, so that a heating space 15 is formed therebetween. At the same time, a thermal air with appropriate temperature is provided to the air supply passage 46 of the central air supply unit 43 and the air supply passage 45 of the outer air supply unit 44 by the two thermal air sources 61 and 62, or a same thermal air source, so that the thermal air enters the heating space 15 through the two air supply passages 45 and 46. In this way, the thermal air can control the temperature of the wafer 70 to the appropriate temperature, so that the probing apparatus 10 of the present invention can test the light emitting efficiency of the light emitting chip 71 of the wafer 70 under a specific temperature. For example, the micro laser chip is liable to generate heat to rise the temperature thereof when emitting light. The probing apparatus 10 of the present invention can simulate the temperature of the micro laser chip generating heat when in use to test the micro laser chip under such temperature condition, so as to eliminate the chip with decrease light emitting efficiency under such temperature condition, thereby ensuring the practical efficiency of the micro laser chips passed in the testing.

Preferably, the area A1 of the bottom surface 49 of the air heating device 40, i.e. the area of the bottom surface 412 of the covering plate 41 including the installation hole 413 and the air outlets 453 and 454, is larger than the area A2 of the wafer 70, as shown in FIG. 1. In the condition as shown in FIG. 9 that the covering plate 41 includes the plate 415 and the outer ring 416, the bottom surface 412 of the covering plate 41 includes the bottom surface 412a of the plate 415 including the installation hole 413 and the air outlets 453 and 454, and the bottom surface 412b of the outer ring 416. More preferably, the area A1 of the bottom surface 49 of the air heating device 40 is larger than the range of the movement of the wafer 70, i.e. the range, in which the wafer 70 is moved along the X-axis and Y-axis for all chips 71 of the wafer 70 to be tested. In this way, the wafer 70 is prevented from the situation that some chips 71 of the wafer cannot be received in the heating space 15. Specifically speaking, keeping the probe 55 and the wafer 70 located in the heating space 15 can avoid waste of time to wait for the chip 71 under test to be reheated, so the probing efficiency can be enhanced. If the probe 55 or the wafer 70 leaves the heating space 15 and thereby loses the required temperature for probing, it needs to be reheated when returning to the position for probing. However, the heating space 15 in the present invention is a semi-closed space, which will be specified in the following, so it can heat the wafer 70 in a large area quickly, rather than only heat a single chip 71. Therefore, even though the reheating is needed, the required temperature for probing can be attained quickly. In the above-described process of testing the light emitting chip 71, the temperature sensor 63, e.g. a non-contact thermometer, is adapted to sense the temperature of the light emitting chip 71 and transmit the sensed signal to the temperature control device 64 for the temperature control device 64 to perform a feedback control to the temperature of the thermal air provided by each of the thermal air sources 61 and 62 and the power thereof according to the temperature sensed by the temperature sensor 63. In this way, the temperature of the light emitting chip 71 can be controlled more accurately.

Referring to FIG. 1, in this embodiment, the carrier 20 has the recess 22 for the supporter 30 to be completely located in the recess 22, and the top surface 34 of the supporter 30 is located below the top surface 21 of the carrier 20 for the wafer 70 to be also completely located in the recess 22. In this way, when the probe 55 probes the light emitting chip 71, the recess 22 enables the heating space 15 to have a certain capacity to accommodate the thermal air, and the heating space 15 is a semi-closed space opened by only an air venting gap 16 provided between the carrier 20 and the covering plate 41, so that the thermal air in the heating space 15 is vented through the air venting gap 16 slowly. Preferably, the amount of the thermal air flowing into the heating space 15 through the air supply passages 45 and 46 is greater than the amount of the thermal air vented from the heating space 15 through the air venting gap 16, so that the thermal air can be effectively kept in the heating space 15 to enhance the heating effect. However, the carrier 20 is unlimited to have such recess 22. Besides, the covering plate 41 may be configured with a recessed bottom to be shaped as a saucepan lid for forming the semi-closed heating space 15 to attain relatively better heating effect.

In this embodiment, the air heating device 40 includes the central air supply unit 43 for supplying thermal air to where the probe 55 and the light emitting chip 71 being probed, i.e. the chip under test, are located, and the outer air supply unit 44 for supplying thermal air to the surrounding of the probing device 50. However, the air heating device 40 of the present invention is unlimited thereto, as long as it includes at least one air supply unit to convey the thermal air provided by the thermal air source to the heating space 15. Even though only one air supply unit is included, the air supply unit is unlimited to be combined with the probing device 50 or directly output the thermal air to where the probe 55 is located, as long as the air supply unit enables the thermal air to flow to where the chip under test is located to effectively heat the chip under test. The air heating device having the central and outer air supply units, such as that in this embodiment, can attain even better heating effect, as will be described in detail later.

The central air supply unit 43 is primarily provided to convey the thermal air directly to the light emitting chip 71 under test, thereby raising the temperature of the light emitting chip 71 under test to the required temperature quickly. In particularly, the probe 55 in this embodiment is located in the open air chamber 48 provided at the terminal end of the air supply passage 46 of the central air supply unit 43, and the air outlet openings 477 of the plurality of flow channels 47 of the air supply passage 46 surround the probe 55. Therefore, the air outlet openings 477 of the flow channels 47 can output the thermal air to the surrounding of the probe 55 and the light emitting chip 71 under test quickly and uniformly, and the open air chamber 48 is quite effective in maintaining the thermal air surrounding the probe 55 and the light emitting chip 71 under test, thereby bringing relatively higher heating efficiency. In this embodiment, the through hole 432a of the lower member 432 forming the open air chamber 48 is a conical hole, the inner radius of which gradually decreases from an end of the conical hole relatively farther away from the supporter 30 to another end of the conical hole relatively closer to the supporter 30, that means its inner radius gradually decreases from its top end to its bottom end. In this way, the thermal air located in the open air chamber 48 escapes relatively slowly, thereby attaining even higher heating efficiency.

The outer air supply unit 44 is primarily provided to convey the thermal air to other light emitting chips 71 of the wafer 70 to attain preheating effect, so that each light emitting chip 71 will be preheated to a certain temperature before being tested and thereby will attain the required temperature quickly when being tested. In this embodiment, the communicating air chamber 452 is actually formed by the outer air supply unit 44 and the covering plate 41. Specifically speaking, referring to FIG. 1 and FIG. 4, the top cover 441 of the outer air supply unit 44 has a through hole 441a covered by the circuit board 51. The air outlets 453 surrounding the installation hole 413 correspond in position to the through hole 441a of the top cover 441 and the circuit board 51, which means the air outlets 453 are covered by the circuit board 51 rather than the top cover 441. The air outlets 454 correspond in position to the top cover 441, which means they are covered by the top cover 441. In this way, the communicating air chamber 452 not only includes the space between the top cover 441 and the covering plate 41, but also extends upwardly to include the space in the through hole 441a, thereby containing and outputting relatively more thermal air to the surrounding of the probing device 50 to enhance the efficiency of heating the chips around the chip 71 under test. Besides, the circuit board 51 has a plurality of air vents 511 corresponding in position to the through holes 441a of the top cover 441, as shown in FIGS. 4 and 6, which can provide moderate decompression effect to the communicating air chamber 452.

The air supply passage 46 of the central air supply unit 43 and the air supply passage 45 of the outer air supply unit 44 may communicate with each other, so that the air inlet connector may be disposed on the central air supply unit 43 only and the thermal air is conveyed to the air supply passage 45 of the outer air supply unit 44 from the air supply passage 46 of the central air supply unit 43, or the air inlet connector may be disposed on the outer air supply unit 44 only and the thermal air is conveyed to the air supply passage 46 of the central air supply unit 43 from the air supply passage 45 of the outer air supply unit 44.

Referring to FIG. 10, a probing apparatus 10' according to a second preferred embodiment of the present invention is similar to the above-described probing apparatus 10, the main difference lies in that the supporter 30' is a transparent plate. Although the transparent plate 30' has no such latticed hollow light permeable portion, the whole transparent plate 30' is a light permeable portion 33 with a large area, which can support the wafer 70 and allow the light emitted from the light emitting chip 71 to pass through. In addition, in the first preferred embodiment as shown in FIG. 1, the temperature sensor 63 is located below the carrier 20 to sense the temperature of the bottom surface of the wafer 70 through the opening 23 and the light permeable portions 33. However, in the second preferred embodiment as shown in FIG. 10, the temperature sensor 63' and the temperature control device 64' are disposed above the air heating device 40 and the probing device 50, and the temperature sensor 63' faces the wafer 70 through a through hole 65 of the central air supply unit 43 for sensing the temperature of the top surface of the wafer 70. The foregoing through hole 65 may be provided at other positions of the air heating device 40 or provided on the probing device 50. In the second preferred embodiment as shown in FIG. 10, the probing apparatus 10' further includes an altimeter 66. The altimeter 66 faces the wafer 70 through another through hole 67 of the central air supply unit 43 to sense the height of the wafer 70 for obtaining the distance between the wafer 70 and the probing device 50, so that a feedback control can be performed to the distance which the probing device 50 moves downwardly, thereby making the probe 55 exactly probe the chip 71. Such through hole 67 may be provided at other positions of the air heating device 40 or provided on the probing device 50. The aforementioned temperature sensor 63' and altimeter 66 may be disposed in the through holes 65 and 67 and could be applicable to the above-described first preferred embodiment.

Figure 11:
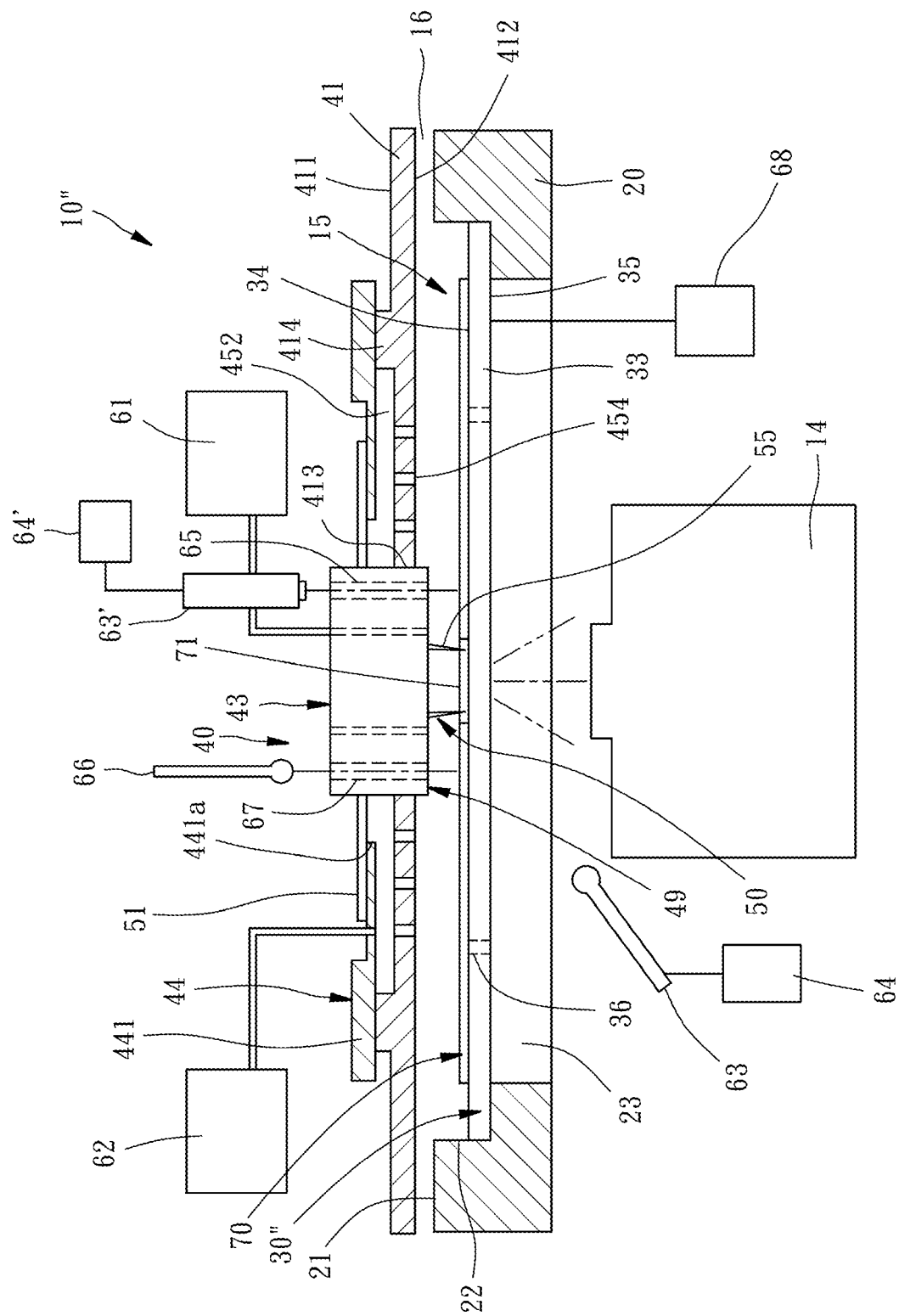
FIG. 11 is a schematic sectional view of a wafer and a probing apparatus according to a third preferred embodiment of the present invention.

Referring to FIG. 11, a probing apparatus 10" according to a third preferred embodiment of the present invention is similar to the above-described probing apparatus 10', the main difference lies in that the supporter 30" is an electrically conductive transparent plate. The transparent plate 30" may be an electrically conductive glass plated with an electrically conductive layer made from indium tin oxide (hereinafter referred to as "ITO"), and electrically connected with a power source 68, thereby powered to generate heat. In this way, the top and bottom surfaces of the wafer 70 are respectively heated by the air heating device 40 and the transparent plate 30" at the same time to enhance the heating efficiency. The probing apparatus 10" further includes another set of the temperature sensor 63 and the temperature control device 64, which are located at the position described in the first preferred embodiment, so that the temperature of the wafer 70 can be sensed by the temperature sensor 63, and the temperature control device 64 electrically connected with the temperature sensor 63 and the power source 68 can perform a feedback control to the power source 68 according to the temperature of the wafer 70, thereby controlling the power of the transparent plate 30" for heating the chip 71. Besides, the transparent plate 30" further has a plurality of vacuum holes 36 for communicating with a vacuum source (not shown), so that the wafer 70 can be attached thereon by vacuum suction. In other words, the transparent plate 30" in this embodiment can support the wafer 70, attach the wafer 70, heat the wafer 70, and allow the light emitted from the chip 71. As shown in FIG. 11, this embodiment may include the aforementioned altimeter 66 to sense the distance between the wafer 70 and the probing device 50 for the feedback control to the distance which the probing device 50 moves downwardly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probing apparatus comprising:
a carrier having an opening;
a supporter having a top surface, a bottom surface, and at least one light permeable portion allowing light to pass through the top surface and the bottom surface, the supporter being disposed on the carrier in a way that the bottom surface faces toward the carrier and the light permeable portion corresponds in position to the opening for a wafer to be disposed on the top surface;
a thermal air source for providing a thermal air;
an air heating device comprising a covering plate and at least one air supply unit disposed on the covering plate, the air heating device having a bottom surface facing toward the top surface of the supporter so that a heating space is provided between the bottom surface of the air heating device and the top surface of the supporter, the air supply unit having an air supply passage communicating with the thermal air source for the thermal air to enter the heating space through the air supply passage; and
a probing device having a probe protruding out of the bottom surface of the air heating device for probing a light emitting chip of the wafer.

2. The probing apparatus as claimed in claim 1, wherein the supporter includes a latticed section having a plurality of said light permeable portions provided in hollow form.

3. The probing apparatus as claimed in claim 2, wherein the probing apparatus further comprises a temperature sensor and a temperature control device; the temperature sensor senses a temperature of the wafer through the opening and the light permeable portion, and the temperature control device is electrically connected with the thermal air source and the temperature sensor; the temperature control device performs a feedback control to the thermal air source according to the temperature sensed by the temperature sensor.

4. The probing apparatus as claimed in claim 1, wherein the carrier has a top surface facing toward the bottom surface of the air heating device and a recess recessed from the top surface of the carrier; the opening is located in the recess; the supporter is completely located in the recess and the top surface of the supporter is located below the top surface of the carrier to make the wafer completely located in the recess.

5. The probing apparatus as claimed in claim 1, wherein the at least one air supply unit of the air heating device comprises a central air supply unit combined with the probing device.

6. The probing apparatus as claimed in claim 5, wherein the at least one air supply unit of the air heating device further comprises an outer air supply unit surrounding the central air supply unit.

7. The probing apparatus as claimed in claim 5, wherein the air supply passage of the central air supply unit comprises an open air chamber directly communicating with the heating space; the probe is located in the open air chamber.

8. The probing apparatus as claimed in claim 5, wherein the air supply passage of the central air supply unit comprises a plurality of flow channels; each of the flow channels has at least one air outlet opening; the air outlet openings of the flow channels surround the probe.

9. The probing apparatus as claimed in claim 8, wherein the air supply passage of the central air supply unit further comprises an open air chamber communicating with the air outlet openings of the flow channels; the probe is located in the open air chamber; the covering plate of the air heating device has a top surface, a bottom surface, and an installation hole penetrating through the top surface and the bottom surface of the covering plate; the central air supply unit comprises a lower member disposed in the installation hole and an upper member disposed on the lower member and located above the top surface of the covering plate; the flow channels are at least partially located in the upper member; the lower member has a through hole forming the open air chamber; the central air supply unit further comprises a connecter disposed between the upper member and the lower member; each of the flow channels comprises an air inlet provided on the upper member, a recess provided on the connecter, and a plurality of air outlets provided in the recess; the probing device comprises a circuit board disposed between the upper member and the connecter; each of the flow channels further comprises a through hole provided on the circuit board.

10. The probing apparatus as claimed in claim 7, wherein the open air chamber is formed by a conical hole; the conical hole has an inner radius gradually decreasing from an end of the conical hole relatively farther away from the supporter to another end of the conical hole relatively closer to the supporter.

11. The probing apparatus as claimed in claim 1, wherein the at least one air supply unit of the air heating device comprises an outer air supply unit surrounding the probing device; the covering plate of the air heating device has a top surface and a bottom surface; the outer air supply unit comprises a top cover, a communicating air chamber located between the top cover and the top surface of the covering plate, and a plurality of air outlets penetrating through the top surface and the bottom surface of the covering plate and communicating with the communicating air chamber; the air supply passage of the outer air supply unit comprises at least one air inlet, said communicating air chamber, and said air outlets; the at least one air inlet is provided on the top cover and communicating with the communicating air chamber; the top cover has a through hole; the probing device comprises a circuit board covering the through hole of the top cover; one or more of the air outlets of the outer air supply unit correspond in position to the through hole of the top cover and the circuit board; the circuit board has a plurality of air vents corresponding in position to the through hole of the top cover.

12. The probing apparatus as claimed in claim 1, wherein when the light emitting chip is probed by the probe, an air venting gap is provided between the carrier and the covering plate for the thermal air in the heating space to be vented.

13. The probing apparatus as claimed in claim 12, wherein an amount of the thermal air flowing into the heating space through the air supply passage is greater than an amount of the thermal air vented from the heating space through the air venting gap.

14. The probing apparatus as claimed in claim 1, wherein the bottom surface of the air heating device has an area larger than an area of the wafer.

15. The probing apparatus as claimed in claim 14, wherein the area of the bottom surface of the air heating device is larger than a range of movement of the wafer.

16. The probing apparatus as claimed in claim 1, wherein the supporter comprises a transparent plate having said light permeable portion.

17. The probing apparatus as claimed in claim 16, wherein the transparent plate is electrically conductive and electrically connected with a power source; the probing apparatus further comprises a temperature sensor for sensing a temperature of the wafer, and a temperature control device electrically connected with the power source and the temperature sensor; the temperature control device performs a feedback control to the power source according to the temperature sensed by the temperature sensor.

18. The probing apparatus as claimed in claim 16, wherein the transparent plate has a plurality of vacuum holes for vacuum suction of the wafer.

19. The probing apparatus as claimed in claim 1, wherein the probing apparatus further comprises a temperature sensor and a temperature control device, the temperature sensor senses a temperature of the wafer and the temperature control device is electrically connected with the thermal air source and the temperature sensor; the temperature control device performs a feedback control to the thermal air source according to the temperature sensed by the temperature sensor; the temperature sensor faces the wafer through a through hole of one of the air heating device and the probing device.

20. The probing apparatus as claimed in claim 1, wherein the probing apparatus further comprises an altimeter facing the wafer through a through hole of one of the air heating device and the probing device for sensing a distance between the wafer and the probing device.

* * * * *